United States Patent
Park

(10) Patent No.: US 6,946,374 B2
(45) Date of Patent: Sep. 20, 2005

(54) METHODS OF MANUFACTURING FLASH MEMORY SEMICONDUCTOR DEVICES

(75) Inventor: Geon-Ook Park, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 46 days.

(21) Appl. No.: 10/738,593

(22) Filed: Dec. 17, 2003

(65) Prior Publication Data

US 2004/0126971 A1 Jul. 1, 2004

(30) Foreign Application Priority Data

Dec. 20, 2002 (KR) .................................. 10-2002-0082004

(51) Int. Cl.[7] .............................................. H01L 29/80
(52) U.S. Cl. ...................... 438/527; 257/259; 257/264; 257/270; 257/595
(58) Field of Search ................................ 257/330, 332, 257/510, 586, 622, 411, 412; 438/230, 237, 259, 264, 265, 267, 270, 595, 696, 700

(56) References Cited

U.S. PATENT DOCUMENTS

| | | | | |
|---|---|---|---|---|
| 5,258,634 A | | 11/1993 | Yang ........................... 257/316 |
| 5,439,970 A | * | 8/1995 | Reeb ........................... 524/558 |
| 5,453,635 A | * | 9/1995 | Hsu et al. .................... 257/336 |
| 5,486,714 A | * | 1/1996 | Hong .......................... 257/321 |
| 5,736,765 A | | 4/1998 | Oh et al. ..................... 257/321 |
| 5,770,514 A | | 6/1998 | Matsuda et al. ............. 438/589 |
| 5,953,062 A | * | 9/1999 | Sugimori et al. ........... 348/364 |
| 5,962,894 A | * | 10/1999 | Gardner et al. ............. 257/330 |
| 6,093,945 A | * | 7/2000 | Yang ........................... 257/317 |
| 6,201,278 B1 | * | 3/2001 | Gardner et al. ............. 257/330 |
| 6,303,437 B1 | * | 10/2001 | Liu ............................. 438/257 |
| 6,329,248 B1 | * | 12/2001 | Yang ........................... 438/267 |
| 6,420,249 B1 | | 7/2002 | Doan et al. .................. 438/589 |
| 6,580,119 B1 | | 6/2003 | Hsieh .......................... 257/315 |
| 6,586,800 B2 | | 7/2003 | Brown ........................ 257/330 |
| 6,764,904 B1 | * | 7/2004 | Liu et al. ..................... 438/259 |

* cited by examiner

Primary Examiner—Alonzo Chambliss
(74) Attorney, Agent, or Firm—Hanley, Flight & Zimmerman, LLC

(57) ABSTRACT

A manufacturing method for fabricating flash memory semiconductor devices is disclosed. According to one example, the manufacturing method may include: forming a trench on a silicon substrate by forming a photoresist pattern on the silicon substrate and performing an etching process using the photoresist pattern; growing a tunneling oxide layer, after removing the photoresist pattern, on a portion of the silicon substrate corresponding to bottom surface of the trench using thermal oxidation process; filling up the trench, after growing the tunneling oxide, by depositing a floating gate poly silicon layer; forming a floating gate, after completion of trench filling, by planarizing the floating gate poly silicon layer to make the height of the floating gate poly silicon layer the same as the silicon substrate; forming a dielectric layer on the floating gate and the silicon substrate; forming a control gate by depositing a control gate poly silicon layer, which serves as a substantial electrode, on the dielectric layer; forming a gate by etching the control gate and the dielectric layer together using photolithography and etching processes for gate defining; performing an oxidation process to the defined gate, which is remained after the etching, to perform oxidation of surrounding area of the defined gate, forming a sidewall by depositing a silicon nitride layer and etching the silicon nitride layer without a separate photolithography process, and performing an implanting process for forming a source and a drain.

8 Claims, 7 Drawing Sheets

PRIOR ART

PRIOR ART

METHODS OF MANUFACTURING FLASH MEMORY SEMICONDUCTOR DEVICES

TECHNICAL FIELD

The present disclosure relates to semiconductor devices and, more particularly, to methods of manufacturing flash memory semiconductor devices.

BACKGROUND

Flash memory is devised to have the advantages of both erasable programmable read only memory (EPROM) and electrically erasable PROM (EEPROM). Accordingly, flash memory provided electrical data programming and erasing and low manufacturing cost due to simple manufacturing process and small chip size.

While flash memory is a non-volatile semiconductor memory in which data is not destroyed by power interruptions, flash memory also has a property of random access memory (RAM) in that programming and erasing of information can be easily performed electrically in a system. Due to its advantages, flash memory is used in memory cards, which are memory devices substituting for a hard disks of portable office automation instruments, and so on.

Flash memory is programmed with data through the injection of hot electrons. That is, when hot electrons are generated in a channel due to potential difference between a source and a drain, some electrons that obtain energy of equal to or more than 3.1 electron-volt (eV), which is a potential barrier between a gate poly silicon and an oxide, move to and are stored in a floating gate by a high electric field applied to a control gate.

Therefore, while a conventional metal-oxide semiconductor (MOS) device is designed to restrain hot electrons because hot electrons may cause inferiority of the device, a flash memory device is designed to generate such hot electrons.

Core elements of a flash memory cell include a tunneling silicon oxide, a floating gate, a dielectric film (Oxide/Nitride/Oxide; ONO), and a control gate. The tunneling silicon oxide serves as a pathway of electrons and holes of a silicon substrate to the floating gate.

Now, a conventional flash memory structure is described with reference to FIGS. 1a–1e.

Referring to FIG. 1a, a tunneling oxide layer 2 is grown by thermal oxidation of a silicon substrate 1. The tunneling oxide layer 2 serves as a pathway of electrons accelerated by an electric field to enter into the floating gate, which will be described later, when the electric field is applied. When the electric field is not applied, the tunneling oxide layer 2 plays a role of blocking electrons entered into the floating gate not to recur to the silicon substrate 1.

Next, a floating gate poly silicon layer is deposited to form a floating gate 3. The floating gate 3 plays a role of storing electrons. It is called to be programmed (memorized) when electrons are charged and to be deleted (removed) when electrons are discharged to the substrate 1.

Referring FIG. 1b, a dielectric layer 4 is formed on the floating gate 3 to have a layered structure of oxide/silicon nitride/oxide.

Subsequently, as shown in FIG. 1c, a control gate poly silicon layer 5 that serves as a substantial electrode is deposited on the dielectric layer 4.

Subsequently, a photoresist pattern is formed and a photolithography and etching process for gate defining are performed to etch the control gate layer 5 and the dielectric layer 4, the floating gate layer 3, and the tunneling oxide layer 2 simultaneously to form a gate 6 as shown in FIG. 1d.

Finally, referring to FIG. 1e, an oxidation process is performed to the defined gate 6, which remains after etching, to perform oxidation of surrounding area of the defined gate 6. A silicon nitride layer is deposited and etched without a separate photolithography process to form a sidewall 7. An ion implanting process for forming a source 8 and a drain 9 is then performed.

However, according to the above conventional technique, overall topography of a wafer becomes complicated because both the floating gate and the control gate are formed on the surface of the silicon substrate by deposition.

To perform a planarization for reducing the height difference, a thickness of an insulating layer should be large. In most cases, the insulating layer over a transistor experiences heat treatment, and stress difference of the insulating layer itself is severely generated. Therefore, stress difference between after and before heat treatment becomes larger as the thickness of the insulating layer becomes larger.

Large changes in stress between before and after heat treatment causes stress-induced damage to the wafer. Such damage may include metal peeling or leakage current influencing the transistor thereunder.

Moreover, because the insulating layer is deposited thick, a large amount of the insulating layer should be removed by chemical mechanical polishing (CMP). According to the characteristic of CMP, planarization quality becomes inferior as the amount of the insulating layer to be removed increases, which means local topography can be caused.

Topography after CMP causes unequal contact resistance in a wafer, which decreases wafer yield.

Prior arts dealing with a subject matter of a semiconductor device having a gate in a trench include the following U.S. Patents.

U.S. Pat. No. 5,258,634 discloses an EPROM including a control gate arranged inside a trench and a floating gate and a manufacturing method thereof, U.S. Pat. No. 5,736,765 discloses an EEPROM which is able to decrease leakage current and improve topography by forming a trench to source and drain areas and forming a gate inside the trench and a manufacturing method thereof, U.S. Pat. No. 6,586,800 discloses a metal oxide semiconductor field-effect transistor (MOSFET) or ACCUFET having double trench gate, U.S. Pat. No. 5,770,514 discloses a vertical FET having a trench gate and a manufacturing method thereof, U.S. Pat. No. 6,420,249 discloses an EEPROM having a floating gate deposited by self-alignment, U.S. Pat. No. 6,580,119 discloses a FET having floating gate electrodes arranged linearly on a surface of a substrate between trenches and source/drain areas arranged as a pair between the floating gate electrodes, and so on.

DETAILED DESCRIPTION

FIGS. 2a–2h are sectional views illustrating an example manufacturing method of a flash memory as disclosed herein.

Figure 1A:
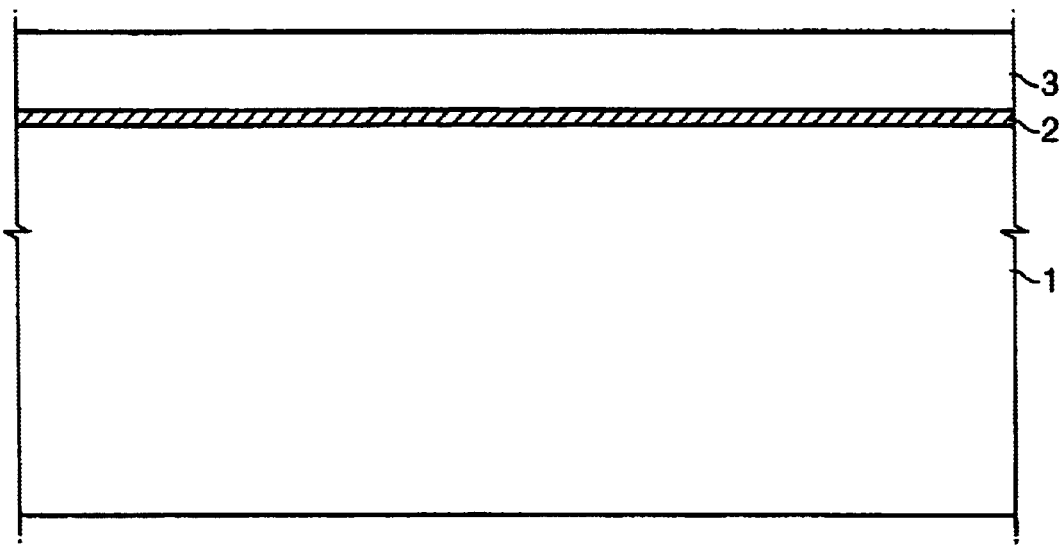
FIGS. 1a–1e are sectional views showing a conventional method of manufacturing a flash memory device.
Figure 1B:
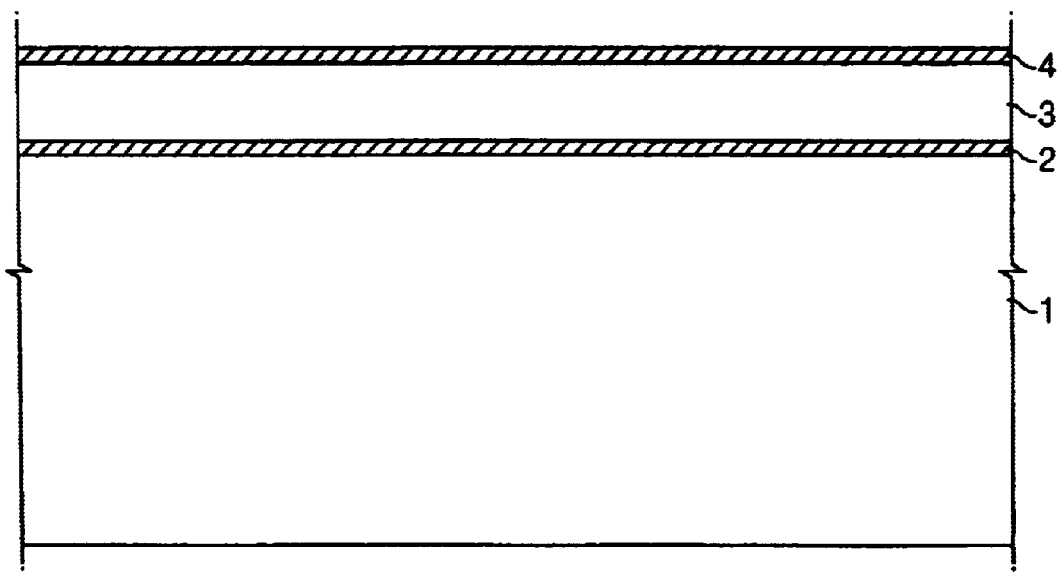
Figure 1C:
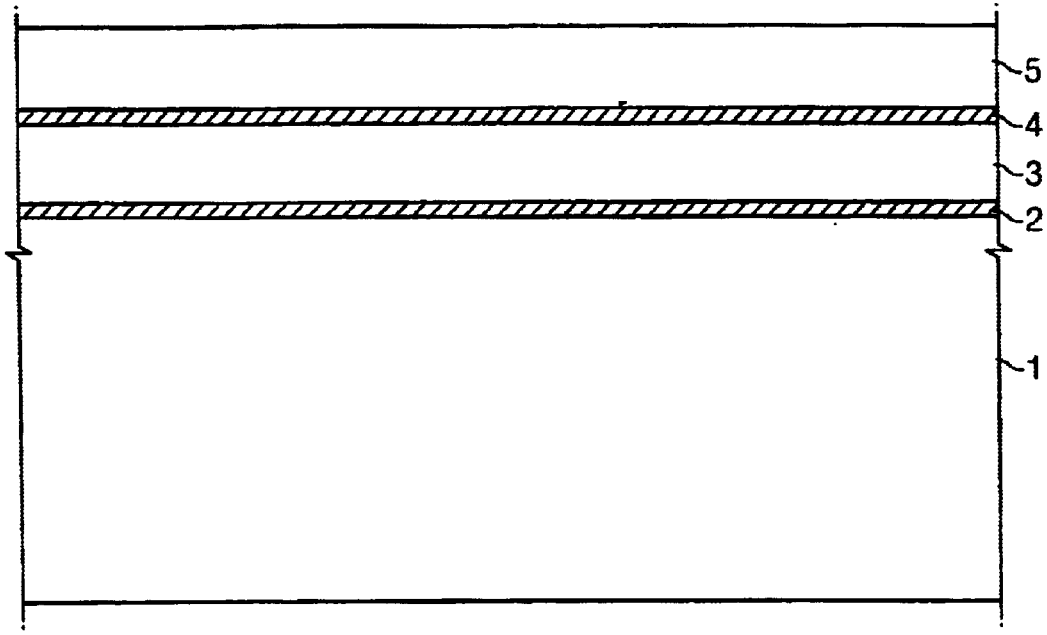
Figure 1D:
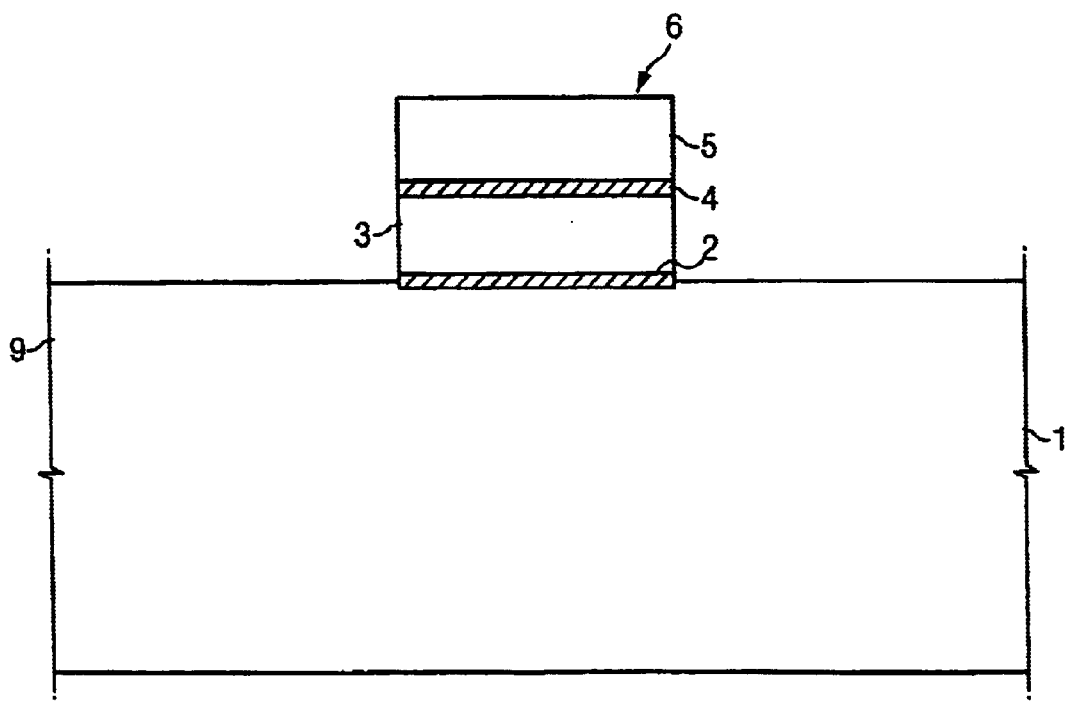
Figure 1E:
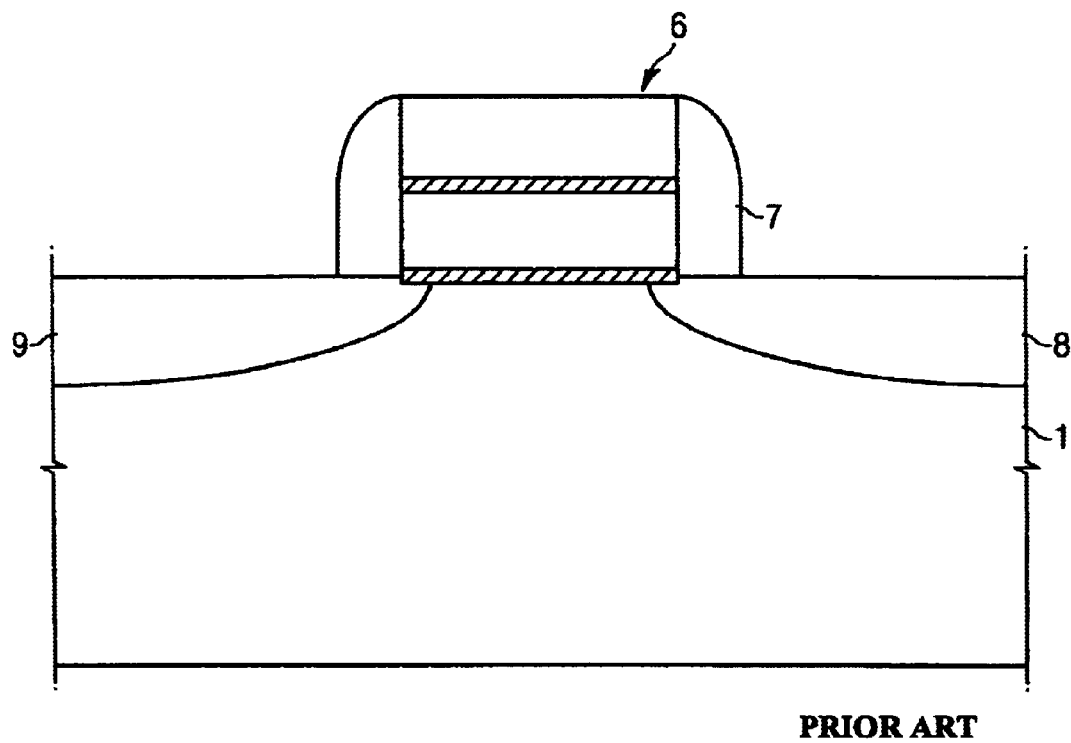
Figure 2A:
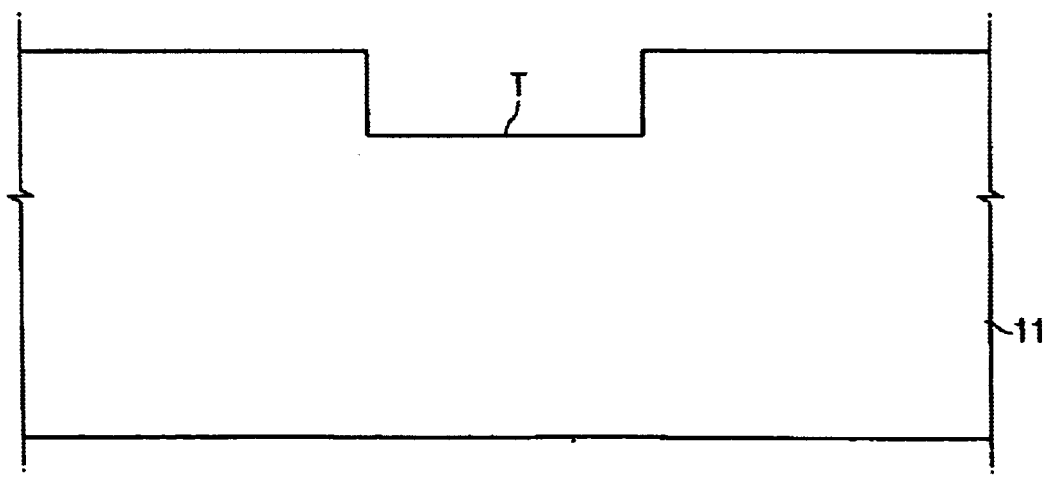
FIGS. 2a–2h are sectional views showing an example of a manufacturing method of a flash memory as disclosed herein.

First, a photoresist pattern is formed on a silicon substrate 11, and the silicon substrate 11 is etched using the photoresist pattern as a mask to form a trench T in the silicon substrate 11, for example, having 2500 Å thickness. Next, the photoresist pattern is removed as shown in FIG. 2a.

Figure 2B:
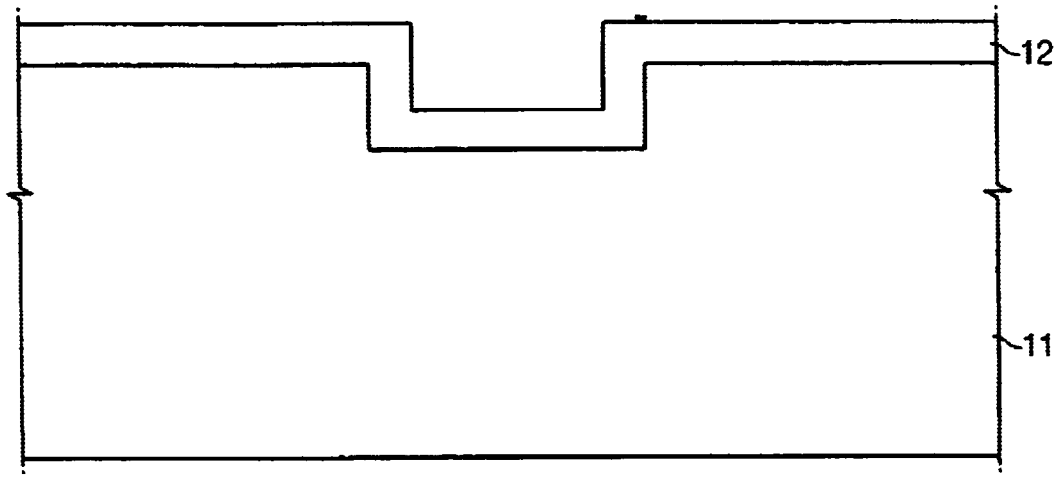

Then, as shown in FIG. 2b, a silicon oxide layer 12 is deposited thereon. The silicon oxide layer 12 is to isolate and insulate a sidewall of an area where a floating gate, which is described below, will be formed from a source and a drain, which will be formed later, and the thickness thereof is determined by considering doses of the source and the drain. For example, a silicon oxide layer 12 of 1000 Å thickness is deposited.

Figure 2C:
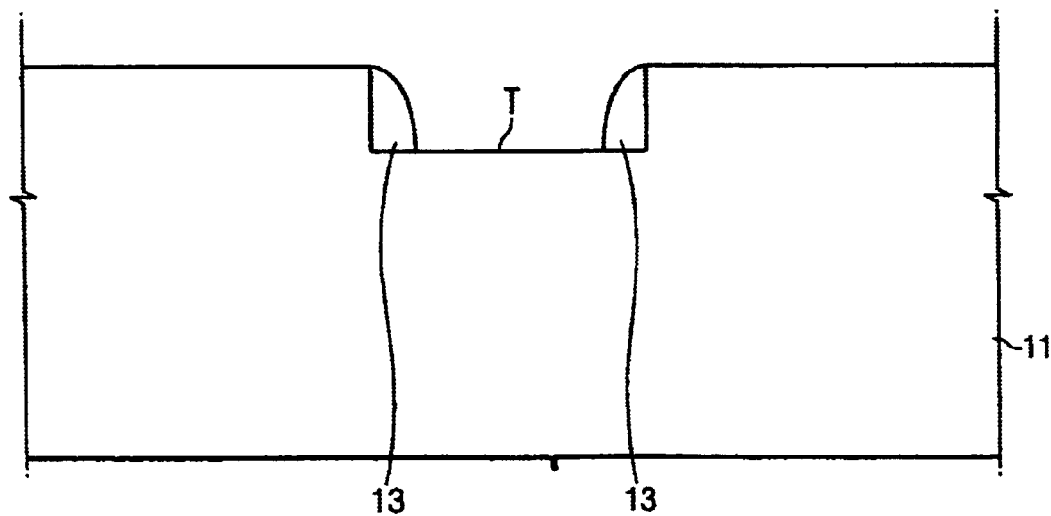

When the deposition is completed, an etching process is performed without a separate photolithography process to form a sidewall spacer 13 on an area where a floating gate will be formed as shown in FIG. 2c.

Figure 2D:
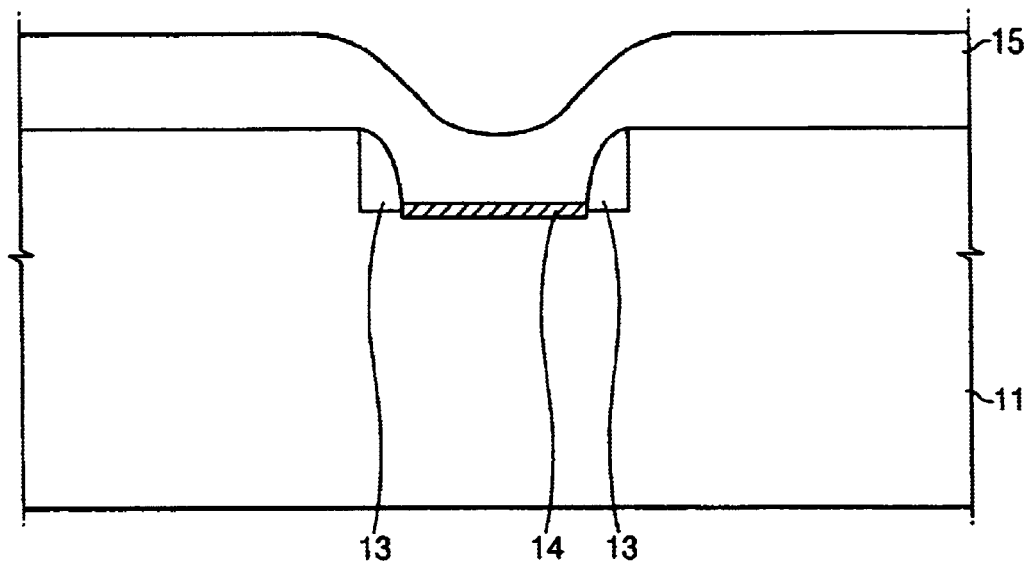

Next, as shown in FIG. 2d, a tunneling oxide layer 14 is grown by thermal oxidation process on a portion of the silicon substrate 11 corresponding to bottom surface of a trench T of which the sidewall spacer 13 is formed. For example, the tunneling oxide 14 is formed to have 100 Å thickness. The tunneling oxide layer 14 serves as a pathway of electrons accelerated by an electric field to enter the floating gate, which is described below, when the electric field is applied to the circuit. When the electric field is not applied, the tunneling oxide layer 14 plays a role of blocking electrons entered into the floating gate not to recur to the silicon substrate 11.

Subsequently, a floating gate poly silicon layer 15 is deposited to fill up the trench T, for example, in 2500 Å thickness. When a section is viewed after trench filling, the floating gate poly silicon layer 15 also has height difference due to the trench T formed in the silicon substrate 11.

Figure 2E:
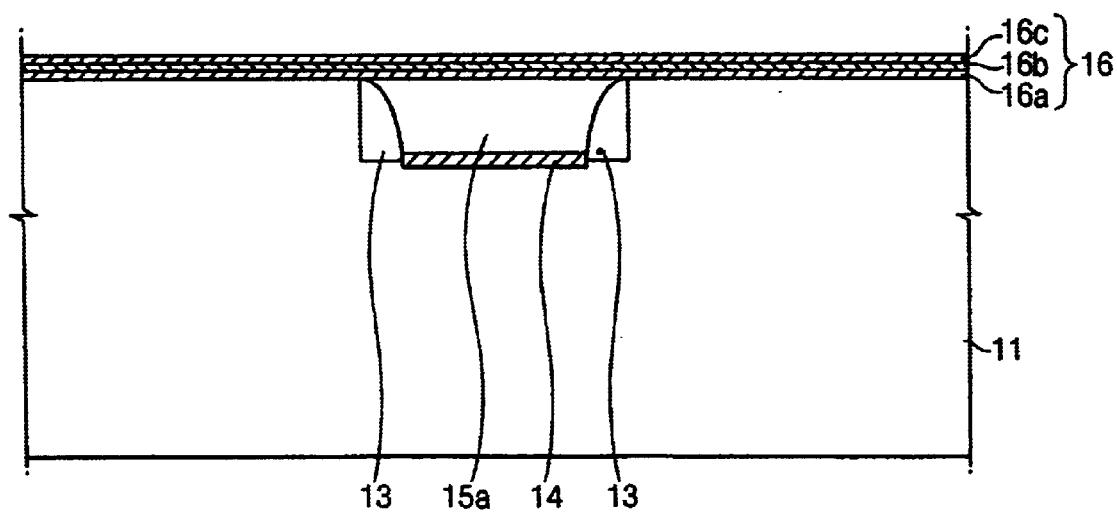

Subsequently, the floating gate poly silicon layer 15 is planarized by CMP or etch-back process to make the height of the floating gate poly silicon layer 15 the same as the silicon substrate 11, thereby forming a floating gate 15a as shown in FIG. 2e.

Then, a dielectric layer 16 is formed on the floating gate 15a and the silicon substrate 11. The dielectric layer 16 can be formed to have oxide/silicon nitride/oxide structure by forming an oxide layer 16a of 60 Å thickness by growing an oxide layer from oxidation of the floating gate 15a, depositing a silicon nitride layer 16b of 80 Å thickness thereon, and depositing another oxide layer 16c of 100 Å thickness thereon. After that, anneal treatment is performed.

The oxide layer 16c is to prevent electrons entered into the floating gate 15a from penetrating to a control gate, which will be described later. The silicon nitride 16b is used for enhancing polarization of the floating gate 15a by a voltage applied to the control gate, which will be described later.

Figure 2F:
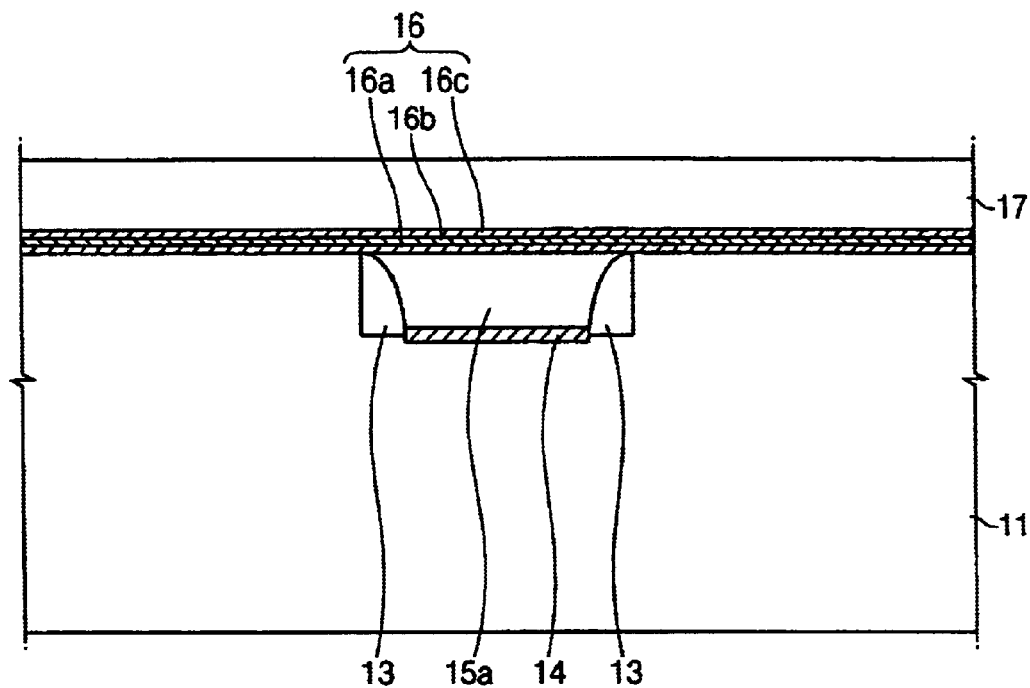

Next, referring to FIG. 2f, a control gate poly silicon layer 17, which serves as a substantial electrode, is deposited to have a thickness of 2500 Å as an example.

Figure 2G:
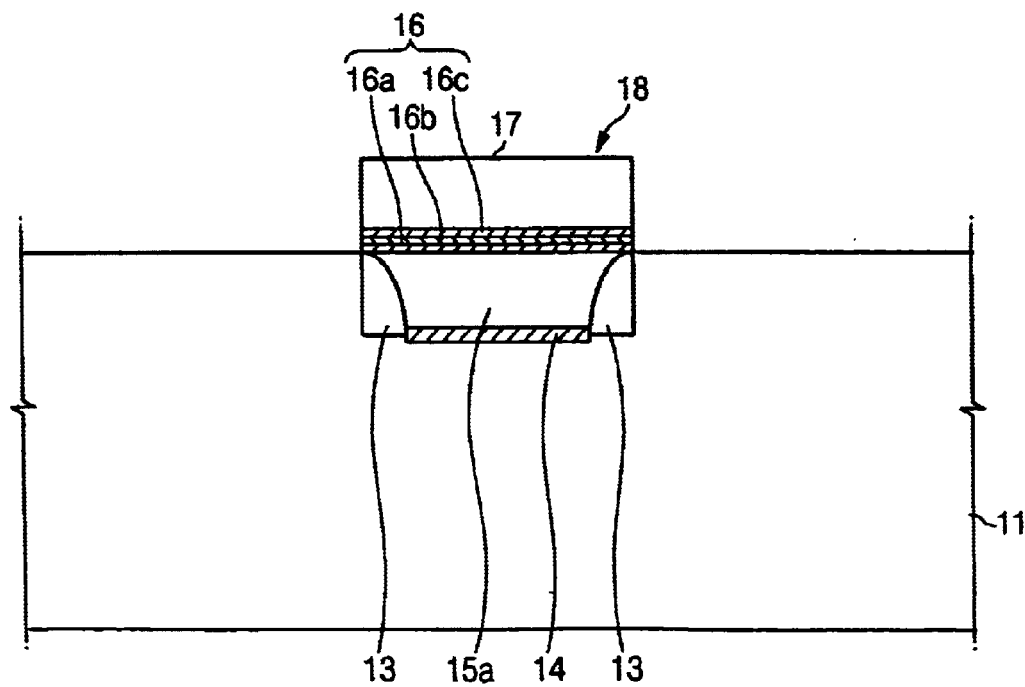

Subsequently, a photoresist pattern is formed and a photolithography and etching process for gate defining are performed to etch the control gate layer 17 and the dielectric layer 16 simultaneously to form a gate 18 as shown in FIG. 2g. After forming the gate 18, the photoresist pattern is removed.

Figure 2H:
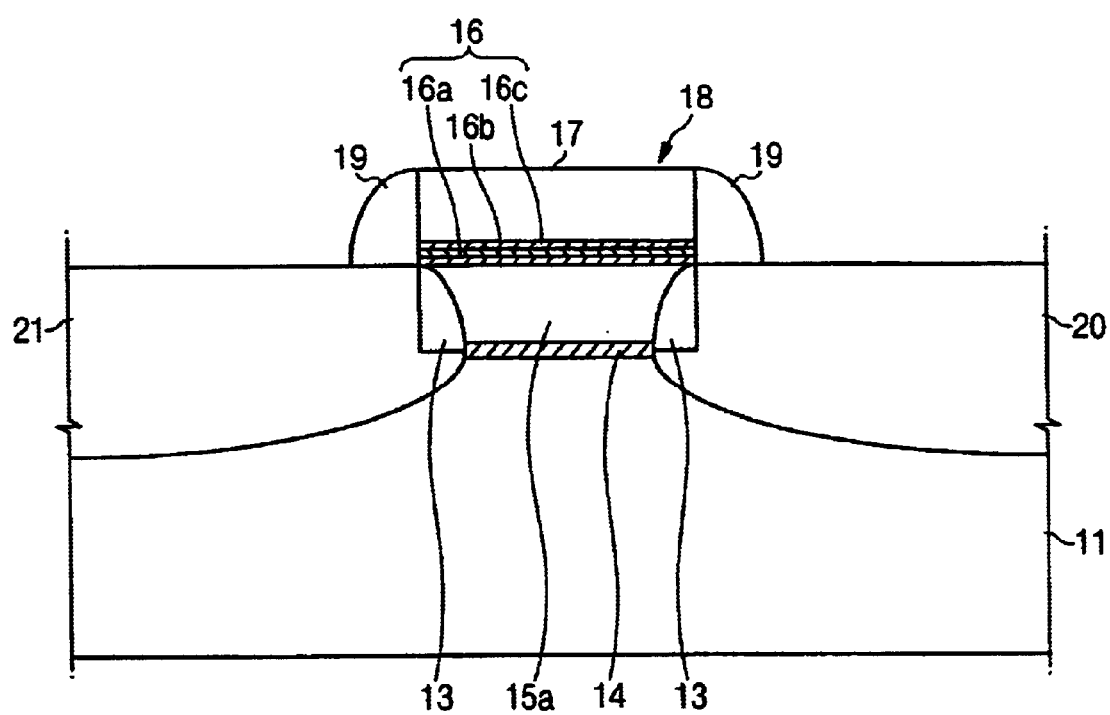

Finally, referring to FIG. 2h, an oxidation process is performed to the defined gate 18, which is remained after etching, to perform oxidation of surrounding area of the defined gate 18. A silicon nitride layer is deposited in 2000 Å thickness as an example and etched without a separate photolithography process to form a sidewall spacer 19. Ion implanting process for forming a source 20 and a drain 21 is performed.

As shown in the above, since the floating gate is formed inside the silicon substrate, only the control gate and a transistor are formed over the silicon substrate. Therefore, the overall height difference of a wafer can be decreased, thereby decreasing thickness of the insulating layer for planarization. Because the thickness of the insulating layer decreases, stress difference of the insulating itself can be reduced remarkably even though heat treatment is performed.

Thus, stress-induced damage generated due to change of stress generated in a wafer can be reduced, thereby preventing metal peeling or leakage current due to the stress-induced damage.

In addition, since the height difference is small, the insulating layer can be easily planarized by CMP or etch-back process of a small amount and the overall surface planability of the wafer is improved. Moreover, small height difference after CMP or etch-back process enables uniform contact resistance in the wafer, thereby improving wafer yield.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A manufacturing method of a flash memory semiconductor device comprising:

forming a trench in a silicon substrate by forming a photoresist pattern on the silicon substrate and performing an etching process using the photoresist pattern;

forming a first sidewall spacer, after removing the photoresist pattern, on the sidewall of the trench;

growing a tunneling oxide layer on a portion of the silicon substrate corresponding to bottom surface of the trench;

filling up the trench by depositing a floating gate poly silicon layer;

forming a floating gate by planarizing the floating gate poly silicon layer to make the height of the floating gate poly silicon layer the same as the silicon substrate;

forming a dielectric layer on the floating gate and the silicon substrate;

forming a control gate by depositing a control gate poly silicon layer on the dielectric layer;

forming a gate by etching the control gate and the dielectric layer together using photolithography and etching processes for gate defining; and performing an oxidation process to the defined gate to perform oxidation of surrounding area of the defined gate, forming a second sidewall spacer on the sidewall of the defined gate, and performing an implanting process for forming a source and a drain.

2. A method as defined by claim 1, wherein the first sidewall spacer is formed by depositing a silicon oxide layer and etching the silicon oxide layer without a separate photolithography process.

3. A method as defined by claim 1, wherein the tunneling oxide layer is grown using thermal oxidation process.

4. A method as defined by claim 1, wherein the dielectric layer is formed to have oxide/silicon nitride/oxide structure.

5. A method as defined by claim 4, wherein the dielectric layer is formed by growing an oxide layer from oxidation of the floating gate, depositing a silicon nitride layer, depositing an oxide layer thereon, and annealing.

6. A method as defined by claim 1, wherein the floating gate poly silicon layer is planarized by chemical mechanical polishing or etch-back process.

7. A method as defined by claim 1, wherein the control gate serves as a substantial electrode.

8. A method as defined by claim 1, wherein the second sidewall spacer is formed by depositing a silicon nitride layer and etching the silicon nitride layer without a separate photolithography process.

* * * * *